(12) United States Patent
Shinjo et al.

(10) Patent No.: US 10,523,158 B2
(45) Date of Patent: Dec. 31, 2019

(54) LOAD MODULATION AMPLIFIER

(71) Applicant: Mitsubishi Electric Corporation, Tokyo (JP)

(72) Inventors: Shintaro Shinjo, Tokyo (JP); Yuji Komatsuzaki, Tokyo (JP); Keigo Nakatani, Tokyo (JP); Koji Yamanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/068,377

(22) PCT Filed: Feb. 23, 2016

(86) PCT No.: PCT/JP2016/055214
§ 371 (c)(1),
(2) Date: Jul. 6, 2018

(87) PCT Pub. No.: WO2017/145258
PCT Pub. Date: Aug. 31, 2017

(65) Prior Publication Data
US 2019/0028062 A1 Jan. 24, 2019

(51) Int. Cl.
*H03F 3/68* (2006.01)
*H03F 1/02* (2006.01)
(Continued)

(52) U.S. Cl.
CPC ............ *H03F 1/0288* (2013.01); *H03F 1/07* (2013.01); *H03F 3/19* (2013.01)

(58) Field of Classification Search
CPC ............ H03F 1/0288; H03F 1/07; H03F 3/68
(Continued)

(56) References Cited

U.S. PATENT DOCUMENTS

| | | | |
|---|---|---|---|
| 5,420,541 A | * 5/1995 | Upton | ............... H03F 1/0288 330/286 |
| 9,362,871 B2 | * 6/2016 | Qureshi | ............... H03F 1/0288 |
| 2007/0008032 A1 | 1/2007 | Kyu et al. | |

FOREIGN PATENT DOCUMENTS

| | | |
|---|---|---|
| EP | 0630104 A2 | 12/1994 |
| JP | 2007-019578 A | 1/2007 |

(Continued)

OTHER PUBLICATIONS

Extended European Search Report issued by the European Patent Office dated Jan. 30, 2019, which corresponds to EP16891417.4-1203 and is related to U.S. Appl. No. 16/068,377.
(Continued)

*Primary Examiner* — Steven J Mottola
(74) *Attorney, Agent, or Firm* — Studebaker & Brackett PC (57) ABSTRACT

Provided is a load modulation amplifier including: a high frequency circuit board; and on the board, an input distribution circuit unit (DC) including: a distributor for dividing one input signal into two signals IS1 and IS2; and a phase delay circuit formed on a signal line for the divided IS2; a carrier amplifier (CA) including a first high frequency transistor for amplifying the IS1; a peak amplifier (PA) including a second high frequency transistor and for amplifying the IS2; and an output combination circuit (OCCU) including: a 90-degree phase delay circuit (90DC) formed on a signal line for output of the CA; a combiner for combining output of the 90DC and output of the PA; and an impedance conversion circuit for converting an output impedance of the combiner. The CA and the PA are directly connected to the OCCU without converting an output impedance.

17 Claims, 9 Drawing Sheets

(51) Int. Cl.
*H03F 1/07* (2006.01)
*H03F 3/19* (2006.01)

(58) Field of Classification Search
USPC .............................................. 330/124 R, 295
See application file for complete search history.

(56) References Cited

FOREIGN PATENT DOCUMENTS

| | | |
|---|---|---|
| JP | 2010-050611 A | 3/2010 |
| JP | 2010-183486 A | 8/2010 |
| JP | 2013-192135 A | 9/2013 |

OTHER PUBLICATIONS

Supplementary European Search Report issued by the European Patent Office dated Feb. 15, 2019, which corresponds to EP16891417.4-1203 and is related to U.S. Appl. No. 16/068,377.

* cited by examiner

FIG. 11

LOAD MODULATION AMPLIFIER

TECHNICAL FIELD

The present invention relates to a load modulation amplifier to be used for, for example, ground-based microwave communication and mobile communication.

BACKGROUND ART

In ground-based microwave communication or mobile communication of recent years, a signal having a large difference between peak power and average power is often used. In this case, a difference between saturation output power of an amplifier configured to amplify a signal and the peak power of the signal is increased. Thus, signal distortion is increased, and operation efficiency of the amplifier is reduced. In view of this, in order to operate the amplifier at high efficiency, a load modulation amplifier typified by a Doherty amplifier is sometimes used as disclosed in Patent Literature 1, for example.

The Doherty amplifier generally divides a high frequency input signal that has been input into two signals. One of the divided signals is input to a carrier amplifier, and the other signal is input to a peak amplifier while being provided with a phase delay of 90 degrees, that is, $\frac{1}{4}\lambda$. Each of the carrier amplifier and the peak amplifier includes matching circuits for obtaining impedance matching on the input side and the output side. The carrier amplifier operates with, for example, an A-class or AB-class bias to always amplify the input signal. Meanwhile, the peak amplifier operates with a C-class bias to amplify the input signal of predetermined power or more. The signals that have passed through the two amplifiers each pass through an impedance converter of a combination circuit unit, and then are combined. The combination circuit unit further includes a ¼ wavelength phase delay line configured to provide a phase delay of 90 degrees to the output on the carrier amplifier side before combination. The combined signal is output via the impedance converter.

The Doherty amplifier ideally has output power at which the maximum drain efficiency is obtained at two positions, and hence an output power range with high drain efficiency can be increased. Therefore, it can be said that the Doherty amplifier is one effective method for achieving a high efficiency characteristic in a system in which a signal having a large difference between peak power and average power is used.

The Doherty amplifier is described in detail later.

CITATION LIST

Patent Literature

[PTL 1] JP 2010-50611 A

SUMMARY OF INVENTION

Technical Problem

However, in the related-art Doherty amplifier, that is, load modulation amplifier, there have been the following problems.

One problem resides in that, when the frequency of the high frequency input signal changes, a desired high frequency characteristic cannot be obtained over a wide bandwidth due to frequency dependence of impedance of the ¼ wavelength phase delay line and variation in characteristic caused by a parasitic capacitance component of a high frequency transistor forming each of the carrier amplifier and the peak amplifier.

Another problem resides in that the size of the amplifier is increased due to an output matching circuit of the amplifier and a correction line for increasing the impedance at the time when the peak amplifier is in an off state.

The present invention has been made in order to solve the above-mentioned problems, and has an object to achieve downsizing and a high efficiency characteristic over a wide bandwidth in a load modulation amplifier, for example, a Doherty amplifier, which is used in a system configured to process a signal having a large difference between peak power and average power.

Solution to Problem

According to one embodiment of the present invention, there are provided a load modulation amplifier and the like including: a high frequency circuit board; an input distribution circuit unit, which includes: a distributor, which is configured to divide one input signal into a first input signal and a second input signal; and a phase delay circuit, which is formed on a signal line for the divided second input signal; a carrier amplifier, which includes a first high frequency transistor, and is configured to amplify the first input signal output from the input distribution circuit unit; a peak amplifier, which includes a second high frequency transistor, and is configured to amplify the second input signal output from the input distribution circuit unit; and an output combination circuit unit, which includes: a 90-degree phase delay circuit, which is formed on a signal line for output of the carrier amplifier; a combiner, which is configured to combine output of the 90-degree phase delay circuit and output of the peak amplifier; and an impedance conversion circuit, which is configured to convert an output impedance of the combiner, the input distribution circuit unit, the carrier amplifier, the peak amplifier, and the output combination circuit unit being formed on the high frequency circuit board, the carrier amplifier and the peak amplifier being directly connected to the output combination circuit unit without converting an output impedance.

Advantageous Effects of Invention

According to the present invention, it is possible to provide the load modulation amplifier capable of achieving downsizing and a high efficiency characteristic over a wide bandwidth.

DESCRIPTION OF EMBODIMENTS

Figure 10:
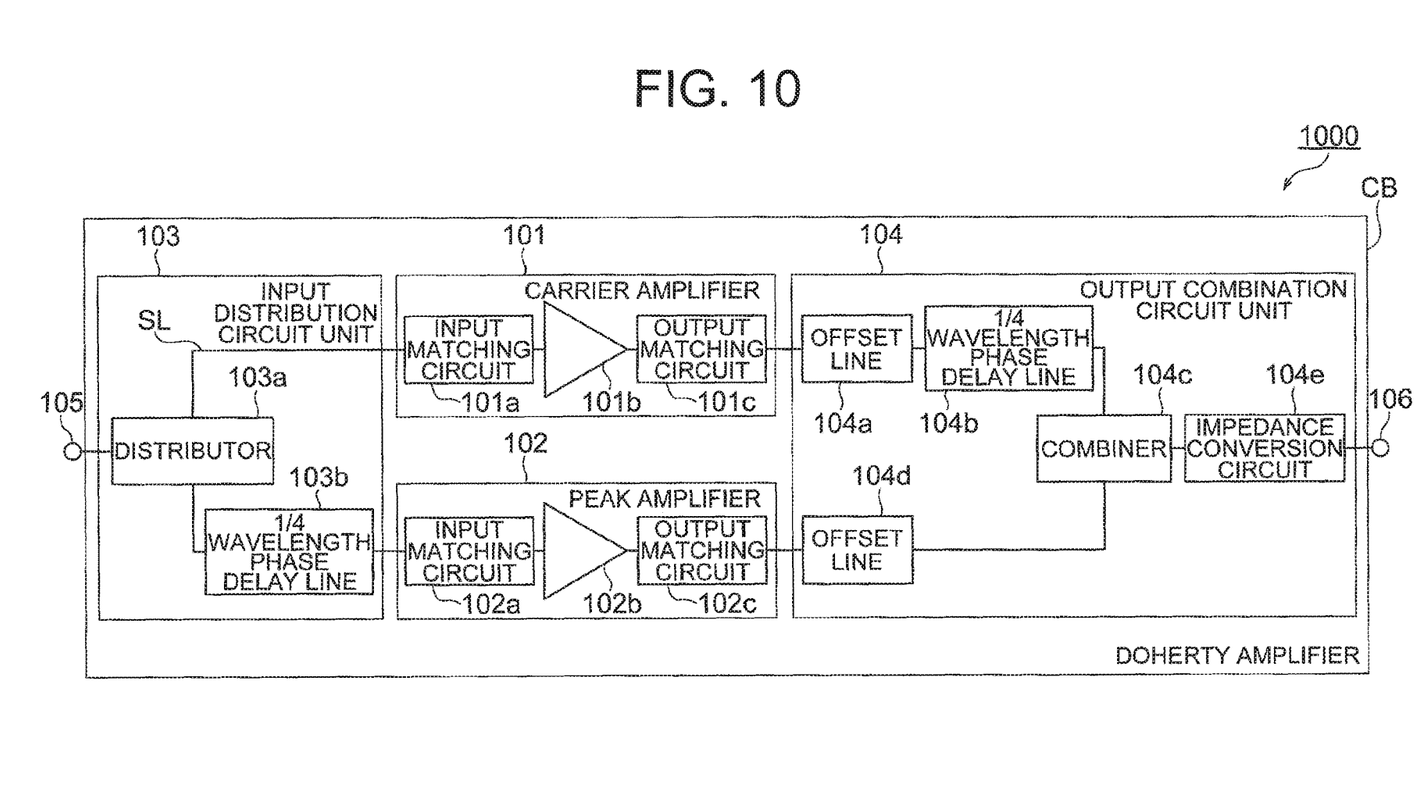
FIG. 10 is a schematic circuit configuration diagram for illustrating an example of a Doherty amplifier that is a general load modulation amplifier.

First, a general load modulation amplifier is described in more detail. FIG. 10 is a schematic circuit configuration diagram for illustrating an example of a Doherty amplifier that is such a general load modulation amplifier as one disclosed in Patent Literature 1, for example. A Doherty amplifier 1000 includes a carrier amplifier 101, a peak amplifier 102, an input distribution circuit unit 103, and an output combination circuit unit 104, which are formed on a high frequency circuit board CB.

The input distribution circuit unit 103 divides a high frequency input signal that has been input to a high frequency input terminal 105 into two signals by a distributor 103a so that power is uniformly divided, for example. One of the divided signals is input to the carrier amplifier 101, and the other signal is input to the peak amplifier 102 via a ¼ wavelength phase delay line 103b configured to provide a phase delay of 90 degrees.

The carrier amplifier 101 includes a carrier amplification element 101b, and an input matching circuit 101a and an output matching circuit 101c on the input side and the output side, respectively.

The peak amplifier 102 includes a peak amplification element 102b, and an input matching circuit 102a and an output matching circuit 102c on the input side and the output side, respectively.

The carrier amplification element 101b operates with, for example, an A-class or AB-class bias to always amplify the input signal. Meanwhile, the peak amplification element 102b operates with a C-class bias to amplify the input signal of predetermined power or more.

The two signals that have passed through the respective amplifiers are combined in the output combination circuit unit 104. The output combination circuit unit 104 includes, on the carrier amplifier side, an offset line 104a and a ¼ wavelength phase delay line 104b configured to provide a phase delay of 90 degrees. Further, the output combination circuit unit 104 includes an offset line 104d on the peak amplifier side. Still further, the output combination circuit unit 104 includes a combiner 104c and an impedance conversion circuit 104e. The impedance conversion circuit 104e outputs the output of the load modulation amplifier from a high frequency output terminal 106.

In this case, for example, the output matching circuit 101c connected to the carrier amplification element 101b causes an output impedance of a high frequency transistor forming the carrier amplification element 101b to match a characteristic impedance (for example, 50Ω) of the ¼ wavelength phase delay line 104b. That is, when the output impedance of the high frequency transistor is 5Ω, the output impedance is caused to match the characteristic impedance of 50Ω of the ¼ wavelength phase delay line 104b.

The ¼ wavelength phase delay line 104b provides a phase delay of 90 degrees on the output side of the carrier amplifier 101. In this manner, the output of the carrier amplifier 101 and the output of the peak amplifier 102 are combined under a state in which the phases are the same at a combination point at the time of saturation operation of the carrier amplifier 101 and the peak amplifier 102.

An electrical length of the offset line 104a is set so that the impedance of the peak amplifier 102 as viewed from the combination point at the time of back-off operation has a high value and ideally an open state. The electrical length of the offset line 104a is equal to an electrical length of the offset line 104d.

The signal obtained through combination in the combiner 104c has its output impedance converted by the impedance conversion circuit 104e, and the resultant signal is output from the high frequency output terminal 106.

The circuits of the Doherty amplifier 1000 illustrated in FIG. 10 are connected to one another by a high frequency signal line SL.

Figure 11:
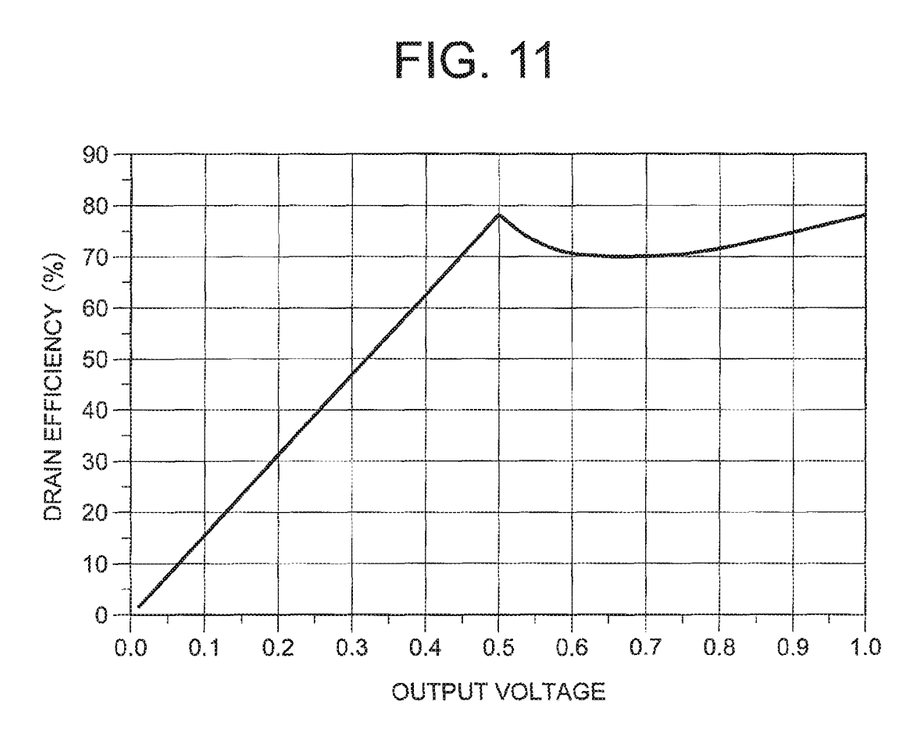
FIG. 11 is a graph for showing a characteristic of the general load modulation amplifier of FIG. 10.

FIG. 11 is a graph for showing the drain efficiency with respect to the output voltage of the above-mentioned general Doherty amplifier. As shown in FIG. 11, when the output power is saturation output, both of the carrier amplifier 101 and the peak amplifier 102 have saturation power, and hence the maximum drain efficiency is obtained. Meanwhile, at an output level at which the output power is at 6 dB back-off from the saturation power, only the carrier amplifier 101 has the saturation power, and the peak amplifier 102 does not amplify the signal. The maximum drain efficiency is obtained also in this case. That is, when only the carrier amplifier 101 operates, the load is twice as large as that when both of the carrier amplifier 101 and the peak amplifier 102 operate. As a result, when only the carrier amplifier 101 operates, the current is reduced to ½ and the output power is reduced to ¼ of those in the case in which both of the carrier amplifier 101 and the peak amplifier 102 operate. Thus, the maximum drain efficiency is obtained at the output at 6 dB back-off when only the carrier amplifier 101 operates.

As described above, the Doherty amplifier ideally has the output power at which the maximum drain efficiency is obtained at two positions, and hence an output power range with high drain efficiency can be increased. Therefore, it can be said that the Doherty amplifier is one effective method for achieving a high efficiency characteristic in a system in which a signal having a large difference between peak power and average power is used.

However, in the Doherty amplifier illustrated in FIG. 10, as described above, when the frequency of the high frequency input signal changes particularly on the output combination circuit unit side, a reactance component of the ¼ wavelength phase delay line is large, and hence the frequency dependence of the impedance cannot be ignored. Thus, there arises a problem in that a desired high frequency characteristic cannot be obtained.

Further, similarly, when the frequency of the high frequency input signal changes, because of a parasitic capacitance component of a high frequency transistor, for example, an FET forming each of the carrier amplifier and the peak amplifier, load modulation depending on output power is not correctly performed at an intrinsic node of the high frequency transistor. Thus, there arises a problem in that a highly efficient characteristic cannot be obtained in a wide bandwidth.

Further, the output-side matching circuit is connected to the output side of the peak amplifier, and hence it is difficult to sufficiently increase the impedance of the peak amplifier as viewed from the combination point at the time of back-off operation, and the efficiency may be degraded at the time of back-off operation.

Further, the ¼ wavelength phase delay line is long, and hence there is a problem in that the amplifier size is increased.

Now, a load modulation amplifier according to the present invention, which is capable of solving the above-mentioned problems, is described with reference to the drawings by way of embodiments. In the embodiments, like or corresponding parts are denoted by like symbols, and redundant description is omitted.

First Embodiment

Figure 1:
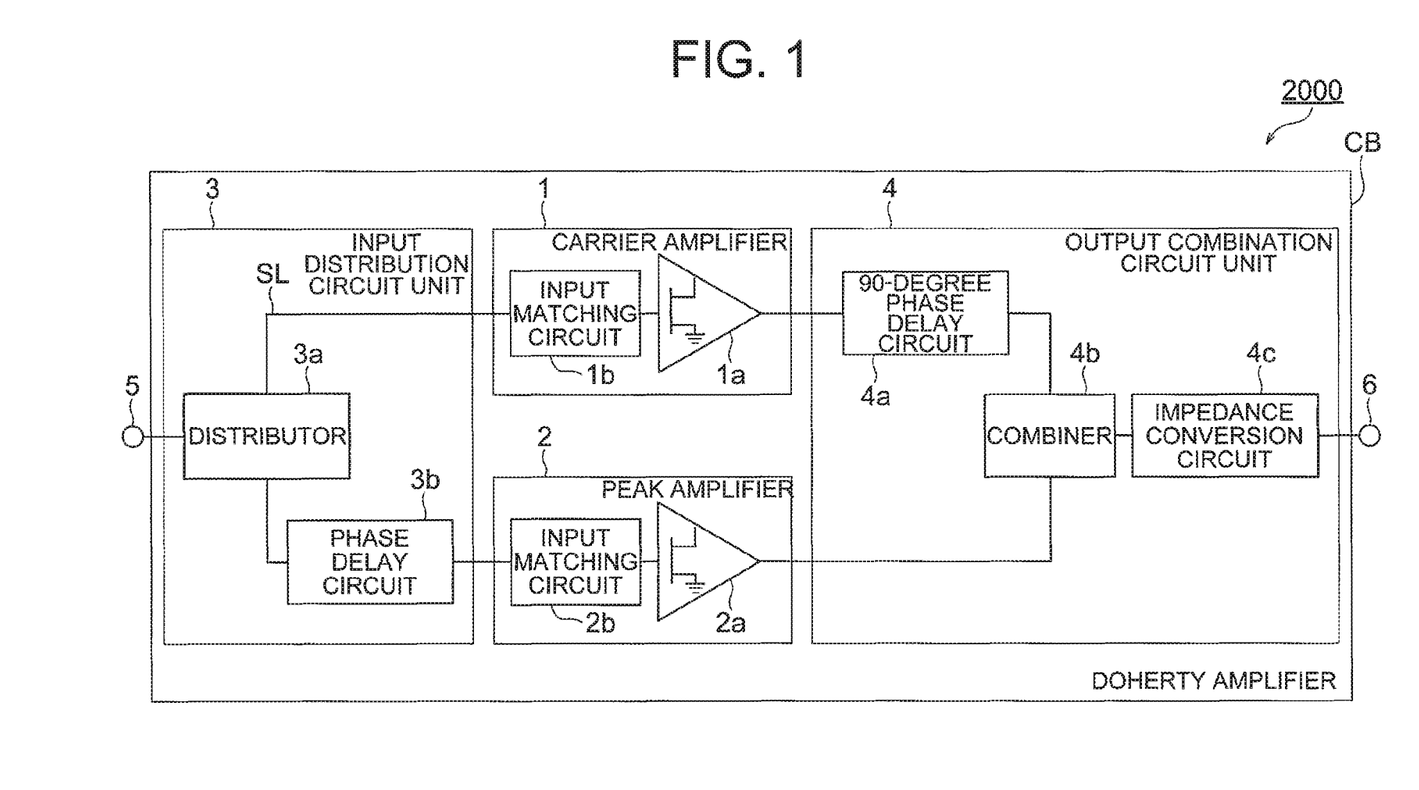
FIG. 1 is a schematic circuit configuration diagram for illustrating a load modulation amplifier according to a first embodiment of the present invention.

FIG. 1 is a schematic circuit configuration diagram for illustrating a Doherty amplifier that is a load modulation amplifier according to a first embodiment of the present invention. A Doherty amplifier 2000 includes a carrier amplifier 1, a peak amplifier 2, an input distribution circuit unit 3, and an output combination circuit unit 4, which are formed on a high frequency circuit board CB. Circuits of the Doherty amplifier 2000 and configuration elements thereof are connected to one another by a high frequency signal line SL formed of, for example, a microstrip line, which is formed on the high frequency circuit board CB. A part of the circuits and configuration elements is formed of the high frequency signal line SL.

The input distribution circuit unit 3 divides a high frequency input signal input to a high frequency input terminal 5 into two signals of first and second input signals by a distributor 3a so that power is uniformly divided, for example. One of the divided signals, which is the first input signal in this case, is input to the carrier amplifier 1, and the other signal, which is the second input signal in this case, is input to the peak amplifier 2 via a phase delay circuit 3b. The phase delay circuit 3b can be formed of, for example, a phase delay line formed of the high frequency signal line SL.

The carrier amplifier 1 includes a first high frequency transistor 1a formed of, for example, a field effect transistor (FET), and an input matching circuit 1b, and does not include an impedance conversion circuit, for example, a matching circuit, on the output side.

Further, the peak amplifier 2 includes a second high frequency transistor 2a formed of, for example, an FET, and an input matching circuit 2b, and similarly does not include an impedance conversion circuit, for example, a matching circuit, on the output side.

In this case, the carrier amplifier 1 operates with, for example, an A-class or AB-class bias to always amplify the input signal. The peak amplifier 2 operates with a C-class bias to amplify the input signal of predetermined power or more.

The respective signals that have passed through the two amplifiers 1 and 2 are combined in the output combination circuit unit 4. The output combination circuit unit 4 includes a 90-degree phase delay circuit 4a directly connected to the carrier amplifier 1, a combiner 4b configured to combine the output signal of the 90-degree phase delay circuit 4a and the output signal of the peak amplifier 2, and an impedance conversion circuit 4c configured to convert the output impedance. The signals of the carrier amplifier 1 and the peak amplifier 2 are combined under a state in which the phases are set to be the same by the 90-degree phase delay circuit 4a at the combination point, that is, the combiner 4b, at the time of saturation operation. The signal obtained through combination is output from a high frequency output terminal 6 via the impedance conversion circuit 4c.

Figure 2:
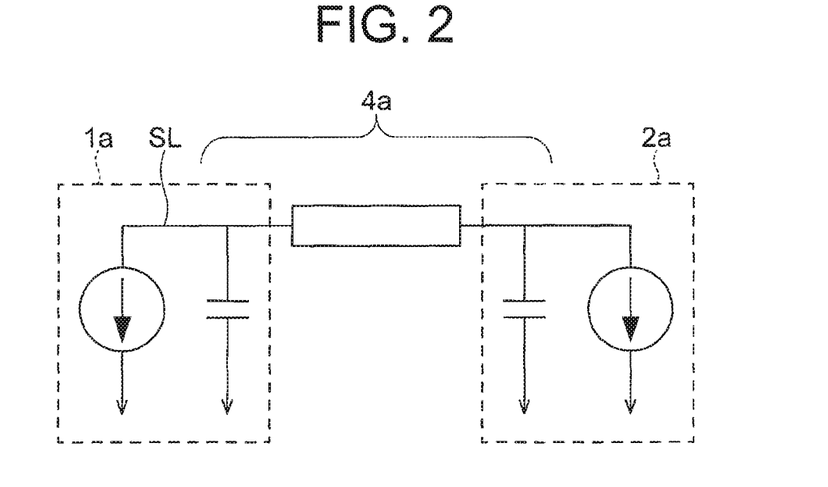
FIG. 2 is a diagram for illustrating an example of a circuit configuration between each amplifier and an output combination circuit unit of FIG. 1.

FIG. 2 is a diagram for illustrating an example of a circuit configuration of the first high frequency transistor 1a of the carrier amplifier 1, the second high frequency transistor 2a of the peak amplifier 2, and the 90-degree phase delay circuit 4a of the output combination circuit unit 4 of FIG. 1. In this case, it is assumed that the 90-degree phase delay circuit 4a is formed of a phase delay line formed of the signal line SL, for example. The phase delay line is equivalently expressed by a parallel capacitance component and a series inductor component as illustrated in, for example, the 90-degree phase delay circuit 4a of FIG. 7 to be referred to later. As described above, the Doherty amplifier has a problem in that, because of a parasitic capacitance component of a high frequency transistor, for example, an FET, forming a high frequency amplification element, load modulation depending on output power is not correctly performed at an intrinsic node of the high frequency transistor. In view of this, as illustrated in FIG. 2, the parasitic capacitance component of the high frequency transistor forming each of the carrier amplifier 1 and the peak amplifier 2 is used as the parallel capacitance component of the phase delay line forming the 90-degree phase delay circuit 4a to normally achieve the load modulation of the Doherty amplifier and achieve a highly efficient characteristic.

Figure 3:
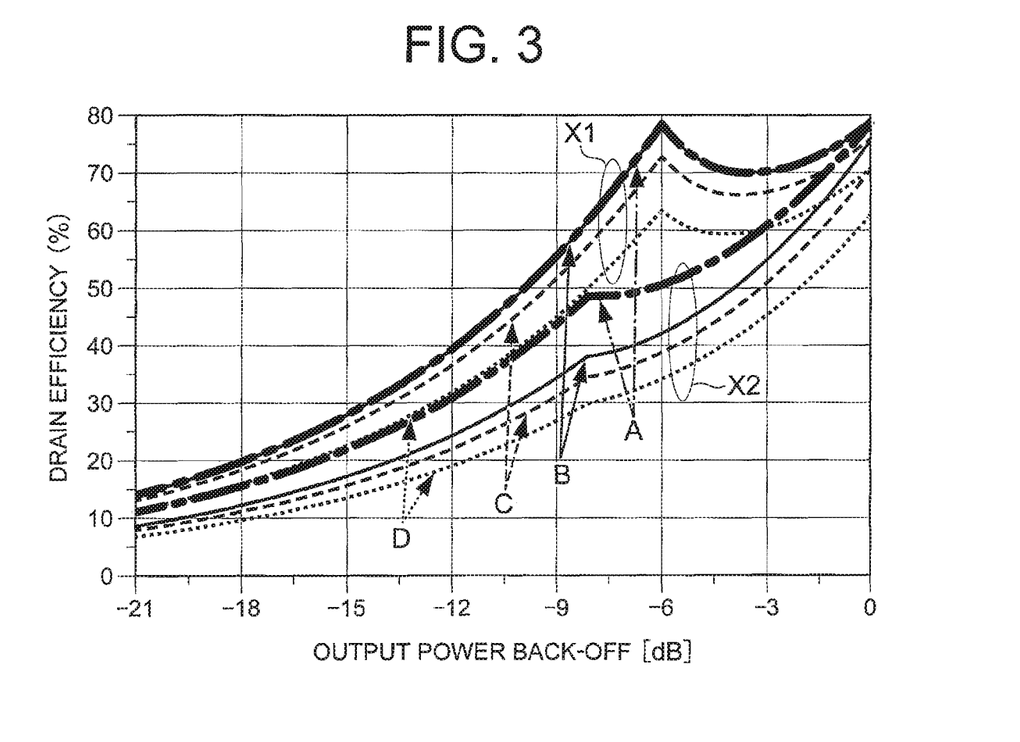
FIG. 3 is a graph for showing an effect of the load modulation amplifier according to the first embodiment of the present invention.

FIG. 3 is a graph for showing the frequency characteristic of the drain efficiency with respect to the output power back-off amount of the Doherty amplifier. In FIG. 3, the following two frequencies are shown:

a reference frequency represented by X1; and a frequency corresponding to (reference frequency)×1.3 represented by X2.

Further, in each frequency, the following cases are shown:

an ideal case in which there is no parasitic capacitance in the high frequency transistor is represented by A (Condition 1);

a case in which the parasitic capacitance is absorbed by the phase delay line, that is, the parasitic capacitance is used in the phase delay line, is represented by B (Condition 2: first embodiment of the present invention); and a case in which there is a parasitic capacitance and the output matching circuit is connected is represented by C and D (Conditions 3 and 4: related-art configuration).

A (Condition 1) is indicated by the long dashed short dashed line, B (Condition 2) is indicated by the solid line, C (Condition 3) is indicated by the broken line, and D (Condition 4) is indicated by the dotted line.

Conditions 3 and 4 assume different output matching circuit losses. As shown in FIG. 3, it is understood that, at the reference frequency (X1), equivalent high efficiency characteristics are achieved in the ideal case (A) and the configuration (B) in the first embodiment of the present invention, but in the related-art configuration (C and D), the efficiency characteristic is degraded in accordance with the loss of the output matching circuit.

Further, it is understood that, even when the frequency changes and the frequency corresponding to (reference frequency)×1.3 is obtained (X2), the efficiency can be improved by about 10 points as compared to the related-art configuration (C and D) by adopting the configuration (B) in the first embodiment of the present invention.

As described above, in the Doherty amplifier that is the load modulation amplifier illustrated in FIG. 1, the parasitic capacitance components of the first high frequency transistor 1a of the carrier amplifier 1 and the second high frequency transistor 2a of the peak amplifier 2 are absorbed by the 90-degree phase delay circuit 4a of the output combination circuit unit 4. In this manner, the load modulation of the Doherty amplifier is normally achieved, and a highly efficient characteristic can be achieved.

That is, the 90-degree phase delay circuit 4a has a circuit constant into which the parasitic capacitance components of the first and second high frequency transistors 1a and 2a are incorporated.

Further, the carrier amplifier 1 and the peak amplifier 2 are connected to the output combination circuit unit 4 without including the impedance conversion circuit, for example, the matching circuit, and hence the amplifier can be downsized. Further, loss due to the matching circuit does not occur, and hence the efficiency can be increased, and the impedance of the peak amplifier 2 as viewed from the combination point at the time of back-off operation can be enhanced. Thus, the efficiency at the time of back-off operation can also be increased.

Second Embodiment

Figure 4:
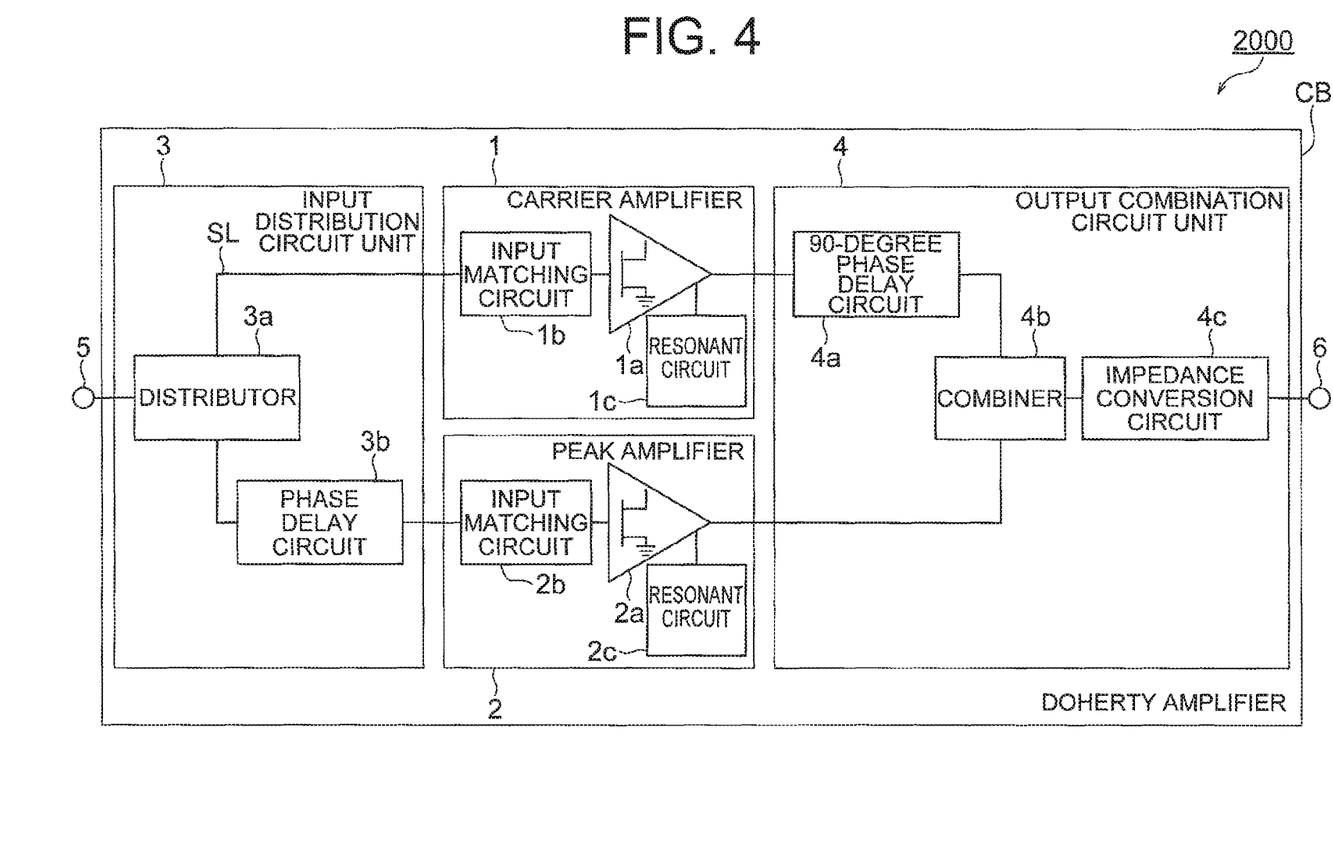
FIG. 4 is a schematic circuit configuration diagram for illustrating a load modulation amplifier according to a second embodiment of the present invention.

FIG. 4 is a schematic circuit configuration diagram for illustrating a Doherty amplifier that is a load modulation amplifier according to a second embodiment of the present invention. A Doherty amplifier 2000 includes a carrier amplifier 1, a peak amplifier 2, an input distribution circuit unit 3, and an output combination circuit unit 4, which are formed on a high frequency circuit board CB.

The carrier amplifier 1 includes a first high frequency transistor 1a, a first resonant circuit 1c configured to resonate with a parasitic capacitance of the first high frequency transistor 1a, and an input matching circuit 1b, and does not include an impedance conversion circuit, for example, a matching circuit, on the output side.

Further, the peak amplifier 2 includes a second high frequency transistor 2a, a second resonant circuit 2c configured to resonate with a parasitic capacitance of the second high frequency transistor 2a, and an input matching circuit 2b, and similarly does not include an impedance conversion circuit, for example, a matching circuit, on the output side.

In this case, the carrier amplifier 1 operates with, for example, an A-class or AB-class bias to always amplify the input signal. The peak amplifier 2 operates with a C-class bias to amplify the input signal of predetermined power or more.

Figure 5:
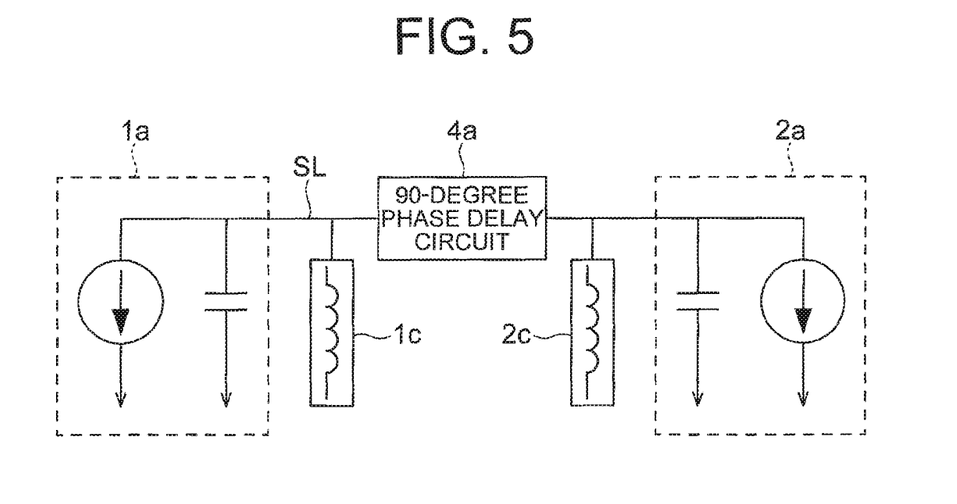
FIG. 5 is a diagram for illustrating an example of a circuit configuration between each amplifier and an output combination circuit unit of FIG. 4.

FIG. 5 is a diagram for illustrating an example of a circuit configuration of the first high frequency transistor 1a and the resonant circuit 1c of the carrier amplifier 1, the second high frequency transistor 2a and the resonant circuit 2c of the peak amplifier 2, and the 90-degree phase delay circuit 4a of the output combination circuit unit 4 of FIG. 4. As described above, the Doherty amplifier has a problem in that, because of a parasitic capacitance component of a high frequency transistor, for example, an FET, forming a high frequency amplification element, load modulation depending on output power is not correctly performed at an intrinsic node of the high frequency transistor. In view of this, as illustrated in FIG. 5, the parasitic capacitance components of the respective high frequency transistors forming the carrier amplifier 1 and the peak amplifier 2 are canceled by the resonant circuits 1c and 2c. Thus, the load modulation of the Doherty amplifier is normally achieved, and a highly efficient characteristic is achieved. In this case, the frequency characteristic of the drain efficiency with respect to the output power back-off amount of the Doherty amplifier is substantially the same as that in FIG. 3.

When the sizes of the respective high frequency transistors forming the carrier amplifier 1 and the peak amplifier 2 differ, the connected resonant circuits 1c and 2c may also differ. Further, as illustrated in FIG. 6, even when parts of the parasitic capacitance components of the respective high frequency transistors are canceled by the resonant circuits 1c and 2c, and the remaining parasitic capacitance component is absorbed by the 90-degree phase delay circuit 4a formed of the phase delay line as in the first embodiment, a similar highly efficient characteristic can be achieved.

Figure 6:
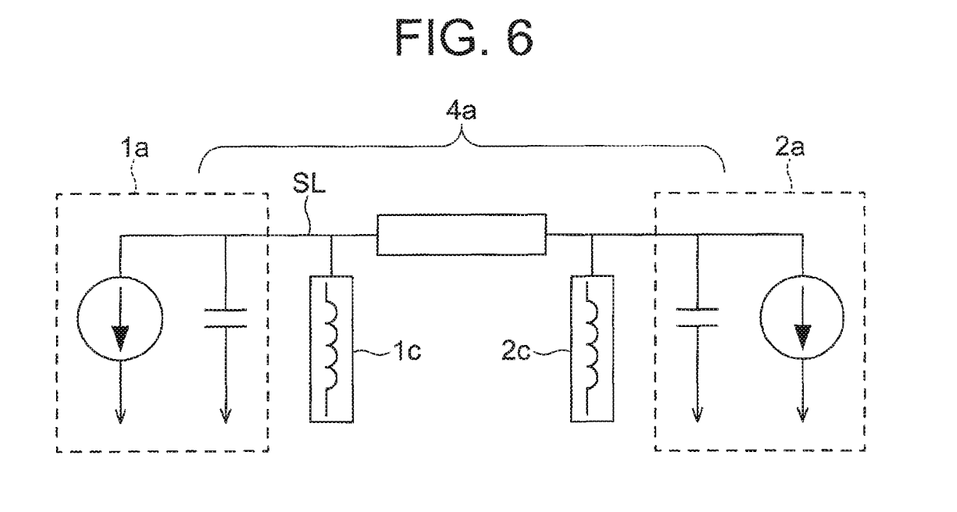
FIG. 6 is a diagram for illustrating another example of the circuit configuration between each amplifier and the output combination circuit unit of FIG. 4.

In FIG. 5 and FIG. 6, the resonant circuit 1c and the resonant circuit 2c are illustrated as inductance elements connected in parallel to the signal line SL as an example, but the configuration of the resonant circuits is not limited thereto.

As described above, in the Doherty amplifier that is the load modulation amplifier illustrated in FIG. 4, parasitic capacitance components of the first high frequency transistor 1a of the carrier amplifier 1 and the second high frequency transistor 2a of the peak amplifier 2, which are high frequency transistors, are canceled by the resonant circuits 1c and 2c. Alternatively, parts of the parasitic capacitance components are canceled and the remaining capacitance component is absorbed by the 90-degree phase delay circuit 4a. In this manner, the load modulation of the Doherty amplifier is normally achieved, and the highly efficient characteristic can be achieved.

That is, the resonant circuits 1c and 2c have a circuit constant that is capable of canceling at least part of the parasitic capacitance components of the high frequency transistors 1a and 2a, and the 90-degree phase delay circuit 4a has a circuit constant into which a capacitance component remaining after the capacitance component is partially canceled is incorporated.

Further, similarly to the above-mentioned first embodiment, the carrier amplifier 1 and the peak amplifier 2 are connected to the output combination circuit unit 4 without including the impedance conversion circuit, for example, the matching circuit. Therefore, the amplifier can be downsized. Further, loss due to the matching circuit does not occur, and hence the efficiency can be increased, and the impedance of the peak amplifier 2 as viewed from the combination point at the time of back-off operation can be enhanced. Thus, the efficiency at the time of back-off operation can also be increased.

Third Embodiment

Figure 7:
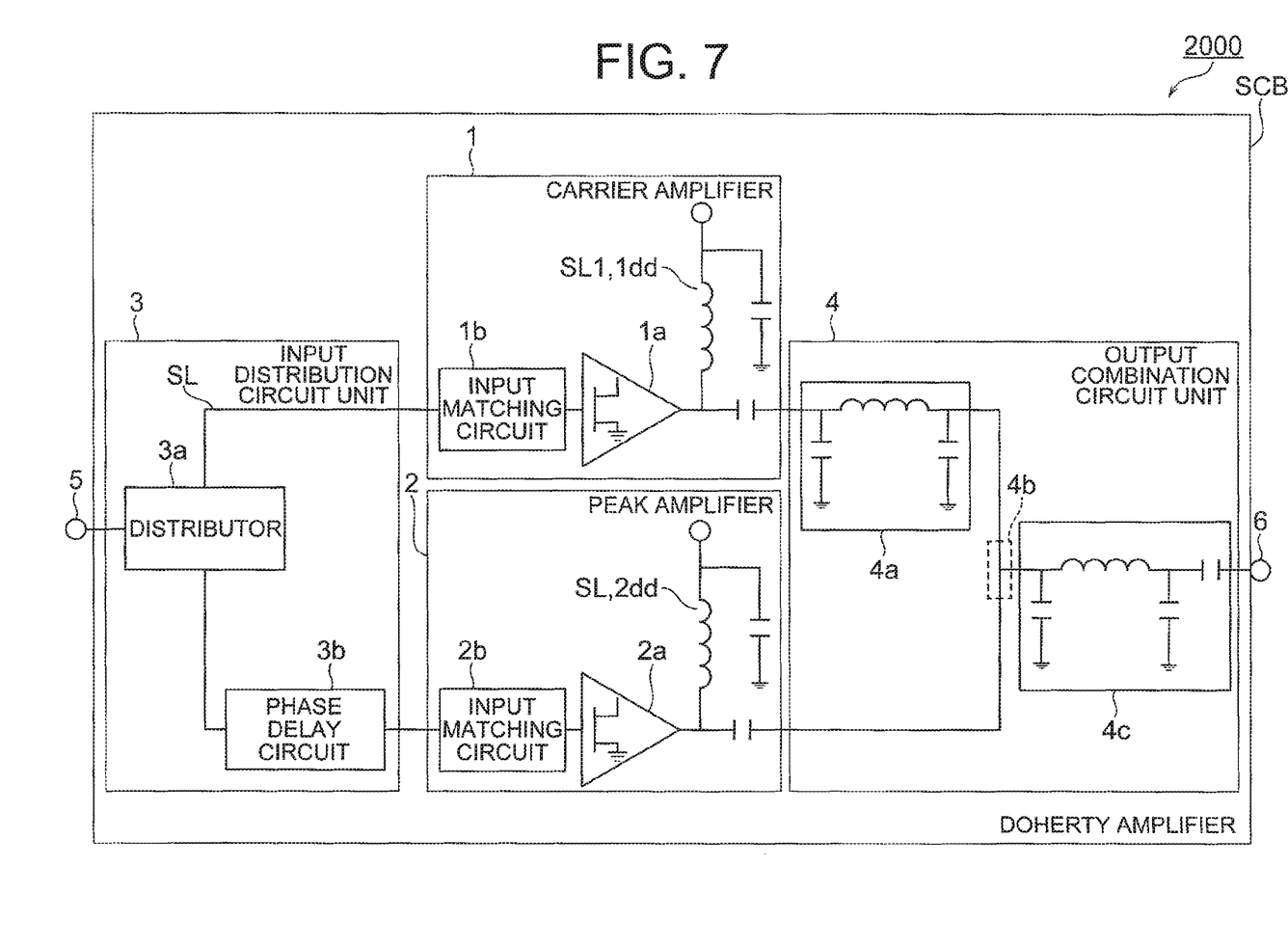
FIG. 7 is a schematic circuit configuration diagram for illustrating a load modulation amplifier according to a third embodiment of the present invention.

FIG. 7 is a schematic circuit configuration diagram for illustrating a Doherty amplifier that is a load modulation amplifier according to a third embodiment of the present invention. A Doherty amplifier 2000 includes a carrier amplifier 1, a peak amplifier 2, an input distribution circuit unit 3, and an output combination circuit unit 4, which are formed as a monolithic integrated circuit with use of a semiconductor board of gallium arsenide (GaAs) or the like. In FIG. 7, a semiconductor board of the monolithic integrated circuit is represented as a semiconductor board SCB.

The carrier amplifier 1 includes a first high frequency transistor 1a and an input matching circuit 1b, and does not include the impedance conversion circuit, for example, the matching circuit, on the output side.

A drain bias line of the first high frequency transistor 1a formed of an FET is formed of a line SL1 or an inductance element 1dd formed on the semiconductor board SCB. The drain bias line may also serve as a resonant circuit configured to cancel the parasitic capacitance component of the first high frequency transistor 1a. In this manner, in addition to increase in efficiency of the Doherty amplifier, the Doherty amplifier can be downsized.

Further, the peak amplifier 2 includes a second high frequency transistor 2a and an input matching circuit 2b, and similarly does not include the impedance conversion circuit, for example, the matching circuit, on the output side.

A drain bias line of the second high frequency transistor 2a formed of an FET is formed of a line SL2 or an inductance element 2dd formed on the semiconductor board SCB. The drain bias line may also serve as a resonant circuit configured to cancel the parasitic capacitance component of the second high frequency transistor 2a. In this manner, an effect similar to that in the case of the carrier amplifier 1 is achieved.

Figure 8:
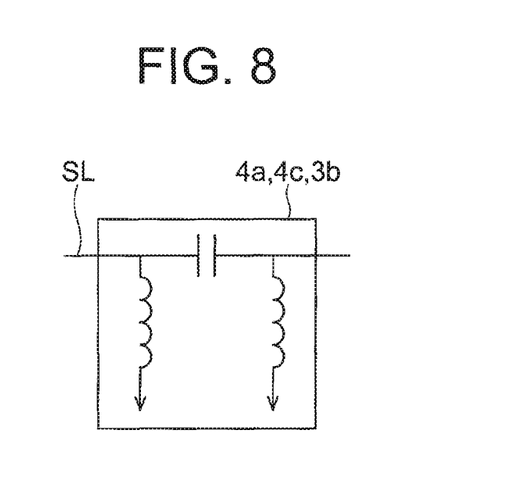
FIG. 8 is a diagram for illustrating a modification example of the load modulation amplifier according to the third embodiment of the present invention.

The output of the carrier amplifier 1 and the output of the peak amplifier 2 are directly connected to the output combination circuit unit 4 without being connected to the impedance conversion circuit, for example, the matching circuit. That is, the output of the carrier amplifier 1 passes through a circuit element of a low-pass filter (LPF) type, which is the 90-degree phase delay circuit 4a, and is then combined with the output of the peak amplifier 2 in the same phase by the combiner 4b formed of a line. In FIG. 7, it is assumed that the output of the carrier amplifier 1 is input to a circuit of the circuit element of the LPF type or a circuit element group of the LPF type, but the output of the carrier amplifier 1 may be input to a circuit of a circuit element of a high-pass filter (HPF) type or a circuit element group of the HPF type illustrated in FIG. 8 without any problem.

The output impedance of the carrier amplifier 1 is about 20Ω when peak output power of several hundreds of milliwatts is required although the output impedance depends on the size of the high frequency transistor 1a. Therefore, the characteristic impedance of the 90-degree phase delay circuit 4a of FIG. 7 is set to about 20Ω. For example, when a line formed on the GaAs semiconductor board is used to implement a delay line having ¼ wavelength phase delay, that is, 90-degree phase delay, at which the characteristic impedance is 20Ω, the line width exceeds 200 μm. In this case, the chip layout of the amplifier becomes difficult, and the amplifier size may be increased. In such a case, it is effective to use a circuit element of the LPF type or the HPF type.

That is, the 90-degree phase delay circuit 4a may be formed of a line on the GaAs semiconductor board SCB, or may be formed of a circuit element. When the 90-degree phase delay circuit 4a is formed of a circuit element, the circuit element or the circuit element group may be any one of the LPF type and the HPF type.

After the output combination, the output of the combiner 4b is connected to the impedance conversion circuit 4c. When the output impedance of the carrier amplifier 1 and the peak amplifier 2 is 20Ω, the output impedance obtained after the output combination at the time of saturation operation is 10Ω, and hence the impedance conversion circuit 4c performs conversion from 10Ω to 50Ω, which is a load impedance. In FIG. 7, a circuit element or a circuit element group of the LPF type is used as the impedance conversion circuit 4c. Further, similarly to the 90-degree phase delay circuit 4a, the impedance conversion circuit 4c can also be implemented by a line SL formed on the GaAs semiconductor board SCB, and further a circuit element or a circuit element group of the HPF type illustrated in FIG. 8 can also be used.

When a transmission amplifier is used in mobile communication or other system that requires high communication quality, in general, a circuit for suppressing harmonic waves, for example, an LPF, is mounted on the output side. As a result, the size of the entire transmitter may be increased, and the cost thereof may be increased. However, when, as illustrated in FIG. 7, the 90-degree phase delay circuit 4a and the impedance conversion circuit 4c are formed with use of circuit elements or circuit element groups of the LPF type, the harmonic wave level at the Doherty amplifier output can be suppressed, and the LPF that is generally connected to the output side of the amplifier can be omitted or reduced in filter order. Thus, this configuration can contribute to downsizing of the entire transmitter and reduction in cost thereof.

Figure 9:
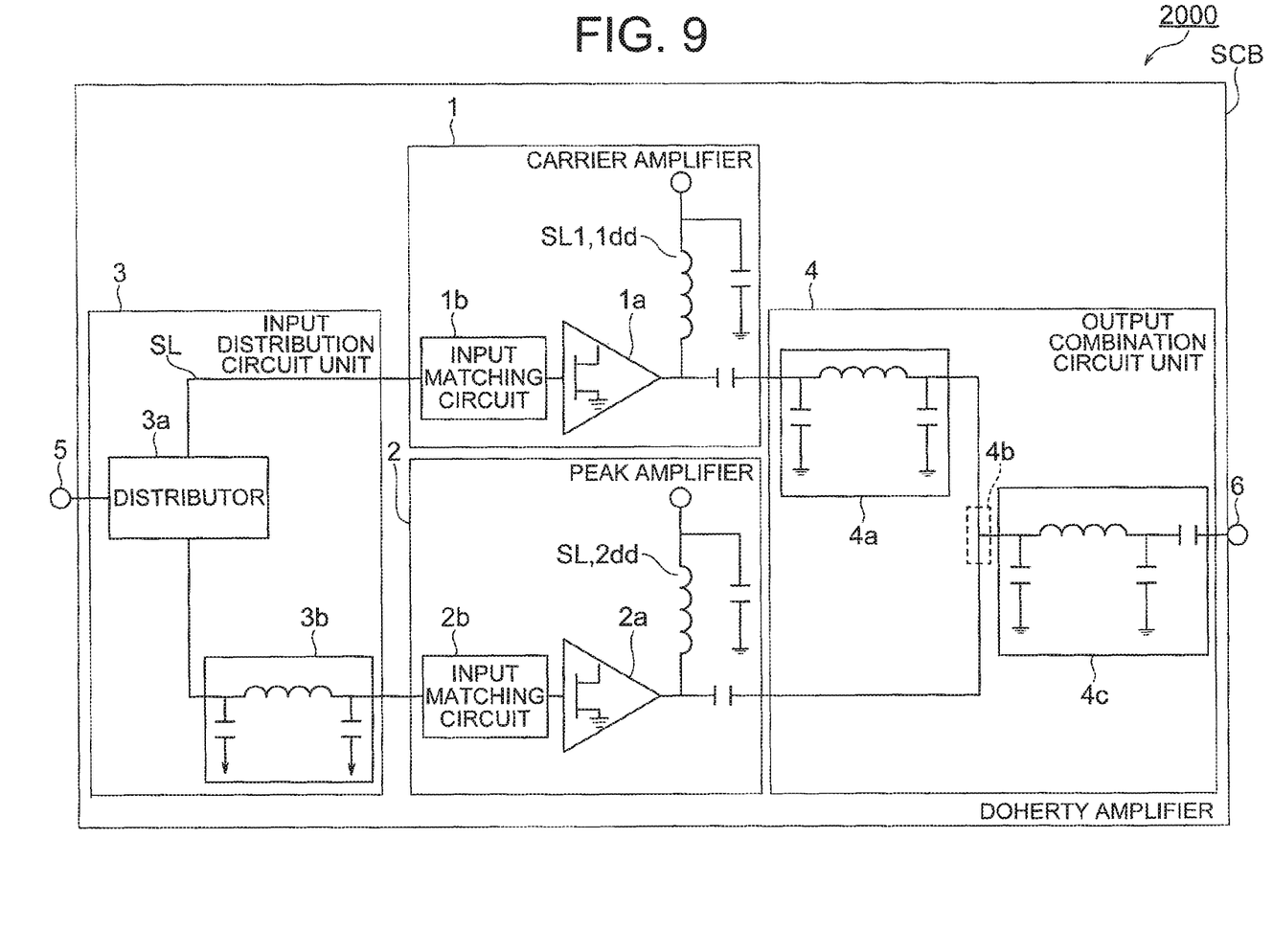
FIG. 9 is a schematic circuit configuration diagram for illustrating another example of the load modulation amplifier according to the third embodiment of the present invention.

Similarly to the 90-degree phase delay circuit 4a and the impedance conversion circuit 4c, as illustrated in FIG. 9, also the phase delay circuit 3b of the input distribution circuit unit 3 may be formed of a line on the GaAs semiconductor board SCB, or may be formed of a circuit element. When the phase delay circuit 3b is formed of a circuit element, the circuit element or a circuit element group may be any one of the LPF type and the HPF type illustrated in FIG. 8.

The present invention is not limited to the above-mentioned embodiments, and encompasses all possible combinations thereof.

INDUSTRIAL APPLICABILITY

The present invention is applicable to a load modulation amplifier of a communication device in a variety of fields.

The invention claimed is:
1. A load modulation amplifier, comprising:
a high frequency circuit board;
an input distribution circuit unit, which includes:
  a distributor, which is configured to divide one input signal into a first input signal and a second input signal; and
  a phase delay circuit, which is formed on a signal line for the divided second input signal;
a carrier amplifier, which includes a first high frequency transistor, and is configured to amplify the first input signal output from the input distribution circuit unit;
a peak amplifier, which includes a second high frequency transistor, and is configured to amplify the second input signal output from the input distribution circuit unit; and
an output combination circuit unit, which includes:
  a 90-degree phase delay circuit, which is formed on a signal line for output of the carrier amplifier;
  a combiner, which is configured to combine output of the 90-degree phase delay circuit and output of the peak amplifier, the output of the 90-degree phase delay circuit and the output of the peak amplifier are separately inputted into the combiner; and
  an impedance conversion circuit, which is configured to convert an output impedance of the combiner,
the input distribution circuit unit, the carrier amplifier, the peak amplifier, and the output combination circuit unit being formed on the high frequency circuit board, a drain terminal of the first high frequency transistor which forms the carrier amplifier, and a drain terminal of the second high frequency transistor which forms the peak amplifier, are directly connected to the output combination circuit unit without having connection with any impedance conversion circuits between the drain terminals and the output combination circuit unit.

2. A load modulation amplifier, comprising:
a high frequency circuit board;
an input distribution circuit unit, which includes:
   a distributor, which is configured to divide one input signal into a first input signal and a second input signal; and
   a phase delay circuit, which is formed on a signal line for the divided second input signal;
a carrier amplifier, which includes a first high frequency transistor, and is configured to amplify the first input signal output from the input distribution circuit unit;
a peak amplifier, which includes a second high frequency transistor, and is configured to amplify the second input signal output from the input distribution circuit unit; and
an output combination circuit unit, which includes:
   a 90-degree phase delay circuit, which is formed on a signal line for output of the carrier amplifier;
   a combiner, which is configured to combine output of the 90-degree phase delay circuit and output of the peak amplifier; and
   an impedance conversion circuit, which is configured to convert an output impedance of the combiner,
the input distribution circuit unit, the carrier amplifier, the peak amplifier, and the output combination circuit unit being formed on the high frequency circuit board,
the carrier amplifier including a first resonant circuit configured to resonate with a parasitic capacitance of the first high frequency transistor, and a drain terminal of the first high frequency transistor being directly connected to the output combination circuit unit without through the impedance conversion circuit,
the peak amplifier including a second resonant circuit configured to resonate with a parasitic capacitance of the second high frequency transistor, and
a drain terminal of the second high frequency transistor being directly connected to the output combination circuit unit without through the impedance conversion circuit.

3. The load modulation amplifier according to claim 2, wherein each of the first resonant circuit and the second resonant circuit includes an inductance element connected in parallel to the signal line.

4. The load modulation amplifier according to claim 1, wherein the load modulation amplifier includes a monolithic integrated circuit, and
wherein the 90-degree phase delay circuit of the output combination circuit unit is formed of the signal line on the high frequency circuit board.

5. The load modulation amplifier according to claim 1, wherein the load modulation amplifier includes a monolithic integrated circuit, and
wherein the 90-degree phase delay circuit of the output combination circuit unit is formed of a circuit element of an HPF type or an LPF type.

6. The load modulation amplifier according to claim 4, wherein the phase delay circuit of the input distribution circuit unit is formed of the signal line on the high frequency circuit board.

7. The load modulation amplifier according to claim 4, wherein the phase delay circuit of the input distribution circuit unit is formed of a circuit element of an HPF type or an LPF type.

8. The load modulation amplifier according to claim 2, wherein the load modulation amplifier includes a monolithic integrated circuit, and
wherein the 90-degree phase delay circuit of the output combination circuit unit is formed of the signal line on the high frequency circuit board.

9. The load modulation amplifier according to claim 3, wherein the load modulation amplifier includes a monolithic integrated circuit, and
wherein the 90-degree phase delay circuit of the output combination circuit unit is formed of the signal line on the high frequency circuit board.

10. The load modulation amplifier according to claim 2, wherein the load modulation amplifier includes a monolithic integrated circuit, and
wherein the 90-degree phase delay circuit of the output combination circuit unit is formed of a circuit element of an HPF type or an LPF type.

11. The load modulation amplifier according to claim 3, wherein the load modulation amplifier includes a monolithic integrated circuit, and
wherein the 90-degree phase delay circuit of the output combination circuit unit is formed of a circuit element of an HPF type or an LPF type.

12. The load modulation amplifier according to claim 8, wherein the phase delay circuit of the input distribution circuit unit is formed of the signal line on the high frequency circuit board.

13. The load modulation amplifier according to claim 5, wherein the phase delay circuit of the input distribution circuit unit is formed of the signal line on the high frequency circuit board.

14. The load modulation amplifier according to claim 10, wherein the phase delay circuit of the input distribution circuit unit is formed of the signal line on the high frequency circuit board.

15. The load modulation amplifier according to claim 8, wherein the phase delay circuit of the input distribution circuit unit is formed of a circuit element of an HPF type or an LPF type.

16. The load modulation amplifier according to claim 5, wherein the phase delay circuit of the input distribution circuit unit is formed of a circuit element of an HPF type or an LPF type.

17. The load modulation amplifier according to claim 10, wherein the phase delay circuit of the input distribution circuit unit is formed of a circuit element of an HPF type or an LPF type.

* * * * *